(12) United States Patent
Davies

(10) Patent No.: US 6,687,312 B1
(45) Date of Patent: Feb. 3, 2004

(54) SIGNAL PROCESSING SYSTEM

(75) Inventor: Thomas Richard Davies, Impington (GB)

(73) Assignee: Cambridge Consultants Limited, Cambridge (GB)

( * ) Notice: Subject to any disclaimer, the term of this patent is extended or adjusted under 35 U.S.C. 154(b) by 0 days.

(21) Appl. No.: 09/462,485

(22) PCT Filed: Jul. 16, 1998

(86) PCT No.: PCT/GB98/02099

§ 371 (c)(1),
(2), (4) Date: Mar. 8, 2000

(87) PCT Pub. No.: WO99/04486

PCT Pub. Date: Jan. 28, 1999

(30) Foreign Application Priority Data

Jul. 18, 1997 (GB) ............................................. 9715278

(51) Int. Cl.[7] ............................. H04L 27/12; H04B 1/04
(52) U.S. Cl. ..................................... 375/302; 375/261
(58) Field of Search .............................. 375/297, 302; 327/237; 330/107

(56) References Cited

U.S. PATENT DOCUMENTS

| 4,462,001 A | | 7/1984 | Girard |
| 5,023,940 A | | 6/1991 | Johnson et al. |
| 5,066,923 A | * | 11/1991 | Gailus et al. ............... 330/107 |
| 5,111,155 A | | 5/1992 | Keate et al. |

(List continued on next page.)

FOREIGN PATENT DOCUMENTS

| EP | 0 638 994 | 2/1994 |
| EP | 0 598 585 | 5/1994 |
| EP | 0 665 641 | 12/1994 |
| EP | 0 648 012 | 4/1995 |
| EP | 0 706 259 | 4/1996 |
| GB | 2 283 140 | 4/1995 |

(List continued on next page.)

OTHER PUBLICATIONS

Petrovic et al., "Phase Delay Compensation in HF Cartesian–Loop Transmitters", Apr. 11–15, 1988, Fourth International Conference on HF Radio Syatems and Techniques, pp. 200–204.*

Petrovic, V., "VHF SSB Transmitter Employing Cartesian Feedback," *IEE Conference on Telecommunications, Radio and Information Technology*, Birmingham, UK, May 1984, Publication No. 235, pp. 161–165.

Mansell A R et al: "Transmitter Linearisation Using Composite Modulation Feedback", Electronics Letters, vol. 32, No. 23, Nov. 7, 1996, pp. 2120/2121 XP000643852.

*Primary Examiner*—Stephen Chin
*Assistant Examiner*—Lawrence Williams
(74) *Attorney, Agent, or Firm*—Oblon, Spivak, McClelland, Maier & Neustadt, P.C.

(57) ABSTRACT

A signal processing system including at least one control loop having a forward path and a feedback path. A signal processor produces a representation of the desired downstream output amplitude and phase as a pair of substantially orthogonal signal components. A feedback-path splitter splits a feedback signal into a plurality of substantially orthogonal feedback signal components which are combined with the corresponding substantially orthogonal signal components to create error signals. A plurality of modulators control the amplitude, frequency, and/or phase of the pair of substantially orthogonal signal components on the basis of control signals which are derived from the error signals. The outputs of the plurality of modulating means are then combined into an output signal. A phase-shift controller in the forward path of the control loop derives the control signals from the error signals on the basis of monitored signal values from at least one predetermined point in the signal processing system.

18 Claims, 13 Drawing Sheets

U.S. PATENT DOCUMENTS

| | | |
|---|---|---|
| 5,134,718 A | 7/1992 | Gailus |
| 5,351,016 A | 9/1994 | Dent |
| 5,381,108 A * | 1/1995 | Whitmarsh et al. ............ 330/2 |
| 5,386,198 A | 1/1995 | Ripstrand et al. |
| 5,420,536 A | 5/1995 | Faulkner et al. |
| 5,467,055 A | 11/1995 | Wray et al. |
| 5,483,681 A | 1/1996 | Bergsten et al. |
| 5,507,014 A | 4/1996 | Wray et al. |
| 5,507,017 A | 4/1996 | Whitmarsh et al. |
| 5,535,247 A * | 7/1996 | Gailus et al. ............... 375/297 |
| 5,551,070 A | 8/1996 | Skarby et al. |
| 5,574,992 A | 11/1996 | Cygan et al. |
| 5,623,226 A * | 4/1997 | Whitmarsh et al. ............ 330/2 |
| 5,652,534 A * | 7/1997 | Taylor et al. ............... 327/237 |
| 5,742,201 A * | 4/1998 | Eisenberg et al. ............ 330/2 |

FOREIGN PATENT DOCUMENTS

| | | |
|---|---|---|
| GB | 2 283 629 | 5/1995 |
| WO | WO 92/08291 | 5/1992 |
| WO | WO 93/18602 | 9/1993 |
| WO | WO 94/05078 | 3/1994 |
| WO | WO 94/17587 | 8/1994 |
| WO | WO 94/17599 | 8/1994 |
| WO | WO 95/06354 | 3/1995 |
| WO | WO 96/37949 | 11/1996 |

* cited by examiner

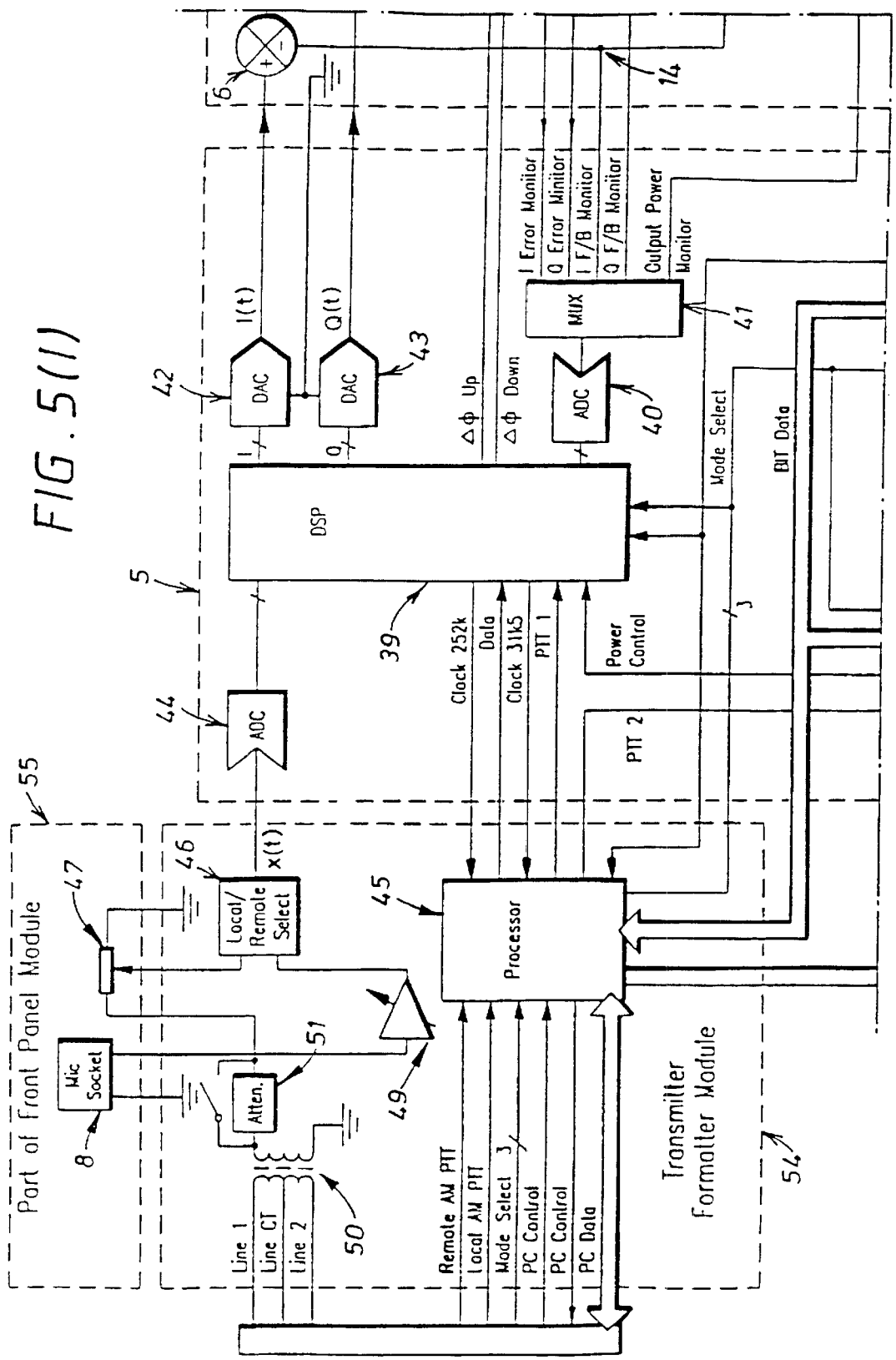

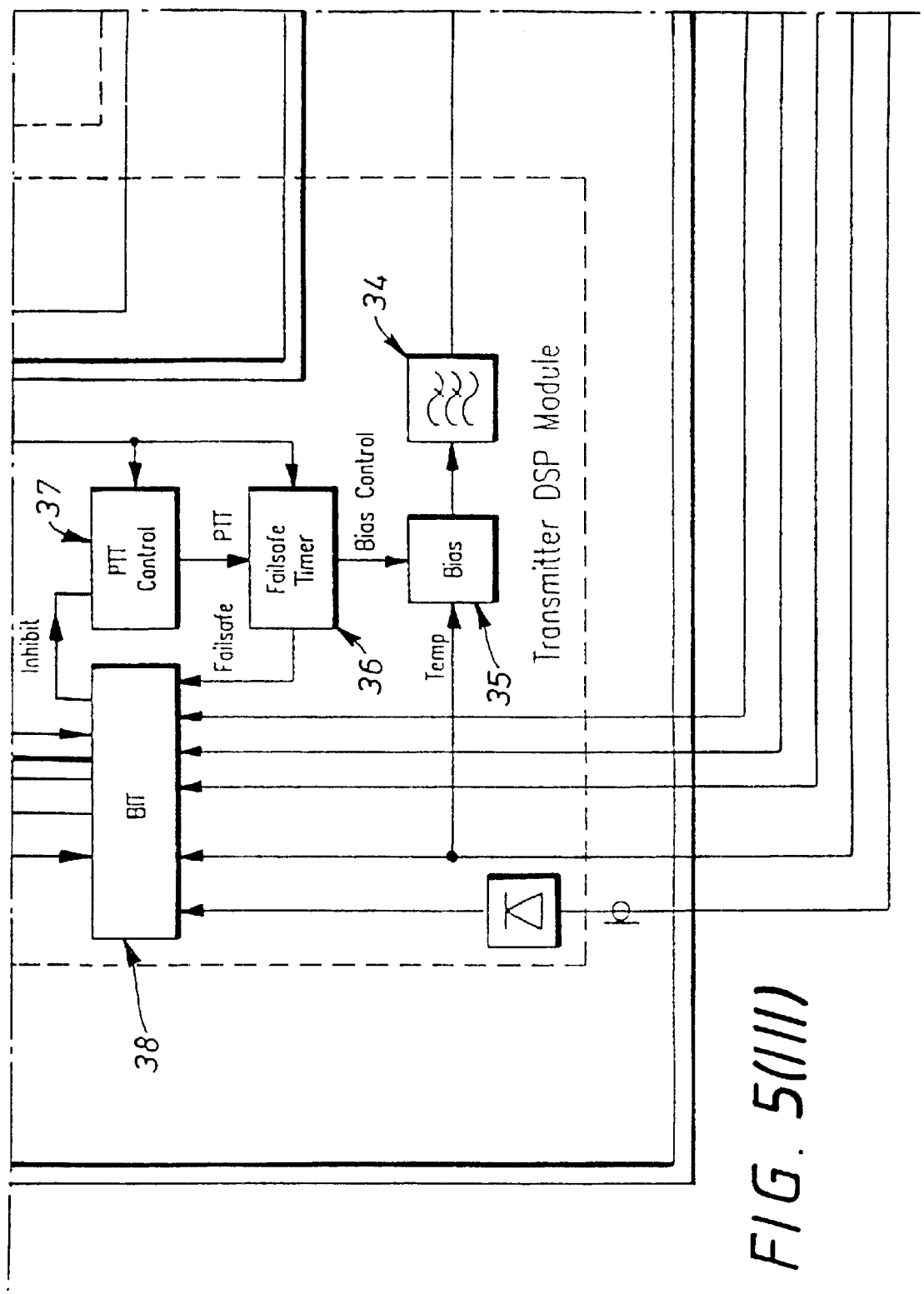
FIG. 5(III)

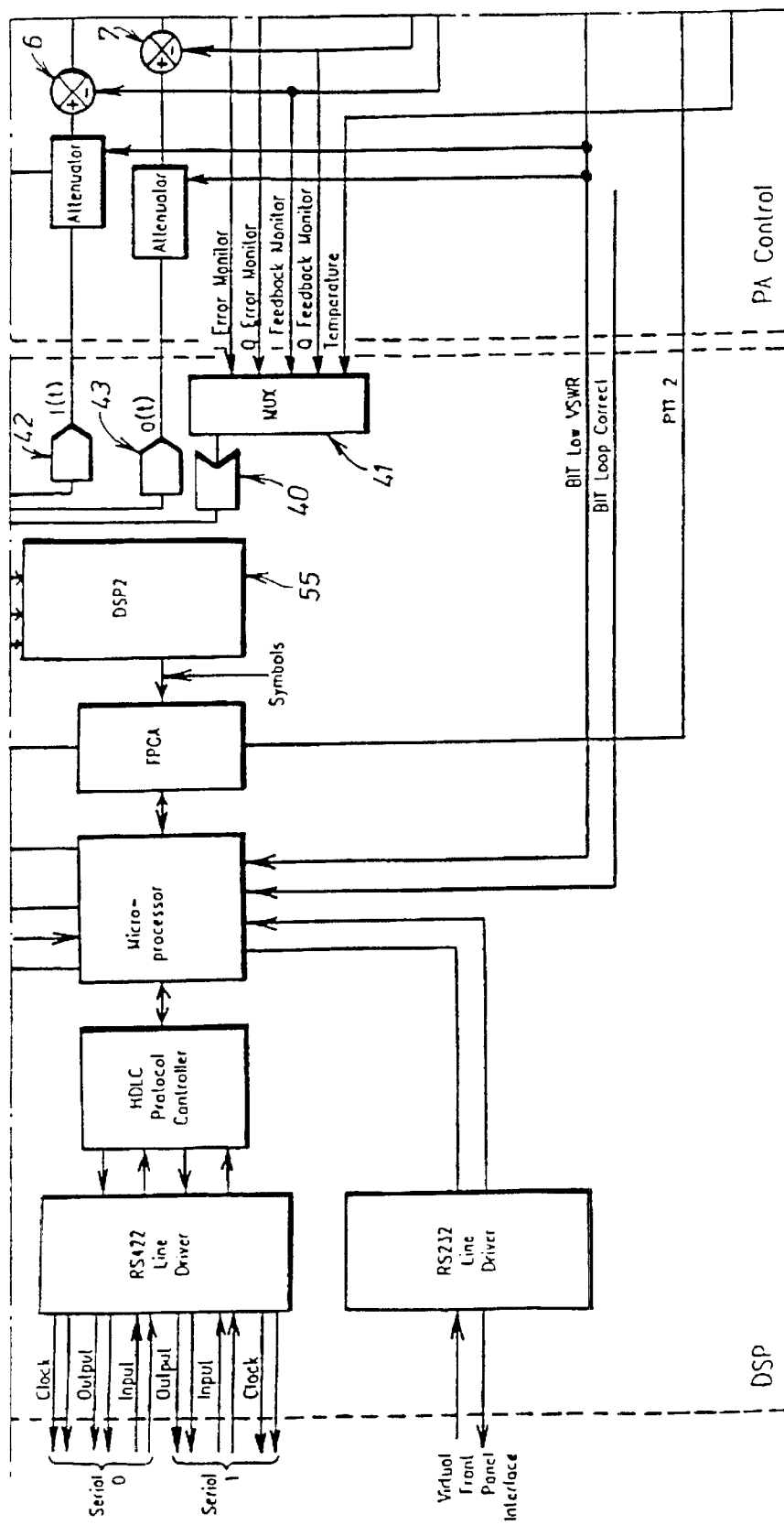
FIG. 6(III)

SIGNAL PROCESSING SYSTEM

This application is a 371 of PCT/GB98/02099 filed on Jul. 16 1998.

BACKGROUND OF THE INVENTION

1. Field of the Invention

The present invention relates to a signal processing system which uses Cartesian loop control. In particular, the present invention relates to a system which may be used for linearising a power amplifier for use in, for example, a radio transmitter which, in turn, may be used in, for example, a VHF digital air traffic control communications system.

2. Discussion of the Background

Many different signal processing systems which are capable of producing output signals and controlling downstream components or systems in an accurate fashion are known in the art. One class of such signal processing systems is that of feedback control systems.

One particular method of feedback control is that of Cartesian feedback control, wherein a control input is split into orthogonal components—an in-phase and a quadrature component—and a feedback signal is similarly split. Feedback is then carried out using these split control input and feedback signals.

A particular application for such Cartesian feedback control is in the linearisation of amplifier stages.

A particular application of linearised amplifier stages is in radio transmitters.

For ease of understanding, the present invention will be described in terms of a particular embodiment in the area of radio transmitters, though its application to many and varied other areas of technology would be evident to a person skilled in the art.

FIG. 1 shows a schematic drawing of a conventional radio transmitter. A signal to be transmitted is created at block 1—via a microphone, for example; this signal is then processed in block 2—modulated, converted to an appropriate frequency for transmission etc.; the processed signal is then amplified (3) and transmitted via some form of antenna (4).

In various applications, the purity of the spectrum has to be very high. This is especially true for applications where a fixed waveband has been allocated for a particular use and there is a desire to get as many users into the available waveband as possible. Such applications include, for example: air traffic control, mobile telephones, radio and television station broadcasts.

For certain modulation standards, the requirement for high spectral purity implies a need for an accurate linear amplification stage (3) in the transmitter. Three options appear to suggest themselves for adequately linearising a transmitter power amplifier:

(i) The use of a very large power amplifier running well below its maximum power and thus well away from non-linear regions. This is the simplest option, but is very inefficient and is a relatively cumbersome option—inevitably large and expensive to make and run.

(ii) The use of a feedforward control technique in which an error signal is formed from the output of the amplifier, by comparison with the input, and the error signal is fed forward and combined in a coupler with the amplifier output to reduce distortion. This technique does allow the use of power-efficient amplifiers, but, it has associated problems. The circuitry of a feedforward technique circuit is sensitive to requirements for the matching of components in the various loops and in transmitter/receiver matching requirements. Such circuits are thus dependent on component characteristics, such as temperature dependence etc. Thus there are practical limits to the degree of spectral control which can be achieved using this feedforward technique and there is substantial cost involved in achieving adequate component matching.

(iii) The use of the Cartesian loop technique, which, in its conventional form (see, for example, IEE Conference Publication Number 235, pages 161–165; V. Petrovic: "VHF SSB Transmitter employing Cartesian Feedback"), allows the use of a power-efficient amplifier and provides very accurate spectral control without the particular matching requirements of the feedforward technique.

However, Cartesian loop control requires control of phase shift around the loop, and this introduces problems with tuning the transmitter over a band of frequencies. In Cartesian controllers, the transmitter has to be readjusted each time the transmission frequency is changed. Prior art controllers used phase-shifting networks operating at radio frequency (RF). These RF phase-shift networks are difficult to design and limited in their phase control range, frequently making it necessary to introduce phase control at more than one point in the circuit. Furthermore, they are subject to drift with time and temperature. If a transmitter is to cover anything other than an extremely narrow band of frequencies, the RF phase-shifting networks need to be readjusted each time a frequency change is made. This is either done manually, which is time consuming and requires skilled personnel, or automatically controlled, e.g. by a microprocessor, which places further demands on the RF phase-shifting network.

A conventional Cartesian feedback apparatus, such as that described in Petrovic's paper (supra), is shown in FIG. 2. In such conventional Cartesian feedback apparatus, the error signals (Ierr, Qerr) are used directly to control the magnitude of the I and Q components derived from the VCO (Voltage Controlled Oscillator) and thus control the magnitude and phase of the transmitter output.

Conventional Cartesian feedback methods use a single VCO for "converting up" signals to radio frequency (RF) as shown in FIG. 3 (see also FIG. 3 of IEE Conference Publication Number 235, pages 161–165; V. Petrovic: "VHF SSB Transmitter employing Cartesian Feedback").

WO-A-96/37948 (British Technology Group) discloses a method for producing a linear transmitter. In this method, the output of the circuit is provided by the control of the two separate oscillators such that their sum is the desired output signal. These separate VCOs will need to be accurately matched and thus such a system will be incapable of the desired accuracy unless a Cartesian feedback is also used. Such a system does not appear to effectively overcome the limitation of not being able to produce a Cartesian feedback loop system which can operate over a broad band of operating frequencies.

SUMMARY OF THE INVENTION

An object of the present invention is to provide a signal processing system and method which very accurately control a downstream component or system over a wide band of frequencies, using a feedback technique which has the advantages of Cartesian loop control mentioned above and which does not have the difficult component-matching requirements of some of the techniques mentioned above.

In one aspect of the invention, such a system is provided by a signal processing system which comprises:

at least one control loop having a forward path and a feedback path;

signal processing means for producing a representation of the desired downstream output amplitude and phase as a pair of substantially orthogonal signal components;

feedback-path splitting means for splitting a feedback signal into a plurality of substantially orthogonal feedback signal components;

first combining means for combining the substantially orthogonal feedback signal components with the corresponding substantially orthogonal signal components to create error signals;

a plurality of modulating means which control the amplitude, frequency and/or phase of the pair of substantially orthogonal signal components on the basis of control signals which are derived from the error signals; and second combining means for combining the outputs of said plurality of modulating means into an output signal;

wherein, said signal processing system further comprises a phase-shift control means in the forward path of the control loop which derives said control signals from said error signals on the basis of monitored signal values from at least one predetermined point in the signal processing system.

Such a system has the advantages that it provides the very high accuracy of Cartesian feedback control for the control of downline components or systems whilst being able to operate over a wide band of operating frequencies and that it does not have the difficult component-matching requirements or transmitter/receiver matching requirements of some other systems. This latter advantage, in turn, means that the system of the invention is easily repeatable—it may be produced in large quantities without the need for extended set-up and trimming procedures which are both time-consuming and costly. Using such a set-up, the phase may be adjusted at will—anywhere between 0° and 360°.

Some other aspects and advantages of the invention are as follows:

the second phase-shift control means may operate at baseband frequency—allowing the use of simple, repeatable and cheap components;

the phase-shift control means may be digital;

the phase-shift control means may be digitally controlled;

the phase-shift control means may be auto-calibrated. This could be achieved in situations where an initialising input signal sequence (a "preamble") is known and the phase-shift control means can check what the feedback is for this known sequence, then, if the feedback is wrong, it can be automatically trimmed accordingly;

if the phase-shift control means is digitally controlled, it may be made self-calibrating using the same principle as for auto-calibration and running a simple algorithm in the digital control means in order to self-trim the phase-shift control means.

The phase-shift control means can also be used to control the gain of the control loop and thus be used to compensate for variable gains within other loop components.

BRIEF DESCRIPTION OF THE DRAWINGS

Further aspects, advantages and objectives of the invention will become apparent from a consideration of the drawings and the ensuing description. In the drawings:

FIGS. 5(I) to 5(IV) show schematic diagrams of four circuits of a more detailed system diagram for a radio transmitter, using the signal processing system of this invention.

FIG. 5 shows a system diagram of circuits 5(I)–5(IV) and;

FIGS. 6(I) to 6(IV) show schematic diagrams of four circuits of a detailed system diagram for a radio transceiver, which uses the signal processing system of this invention.

FIG. 6 shows a system diagram of circuits 6(I)–6(IV);

DESCRIPTION OF THE PREFERRED EMBODIMENT

Figure 1:
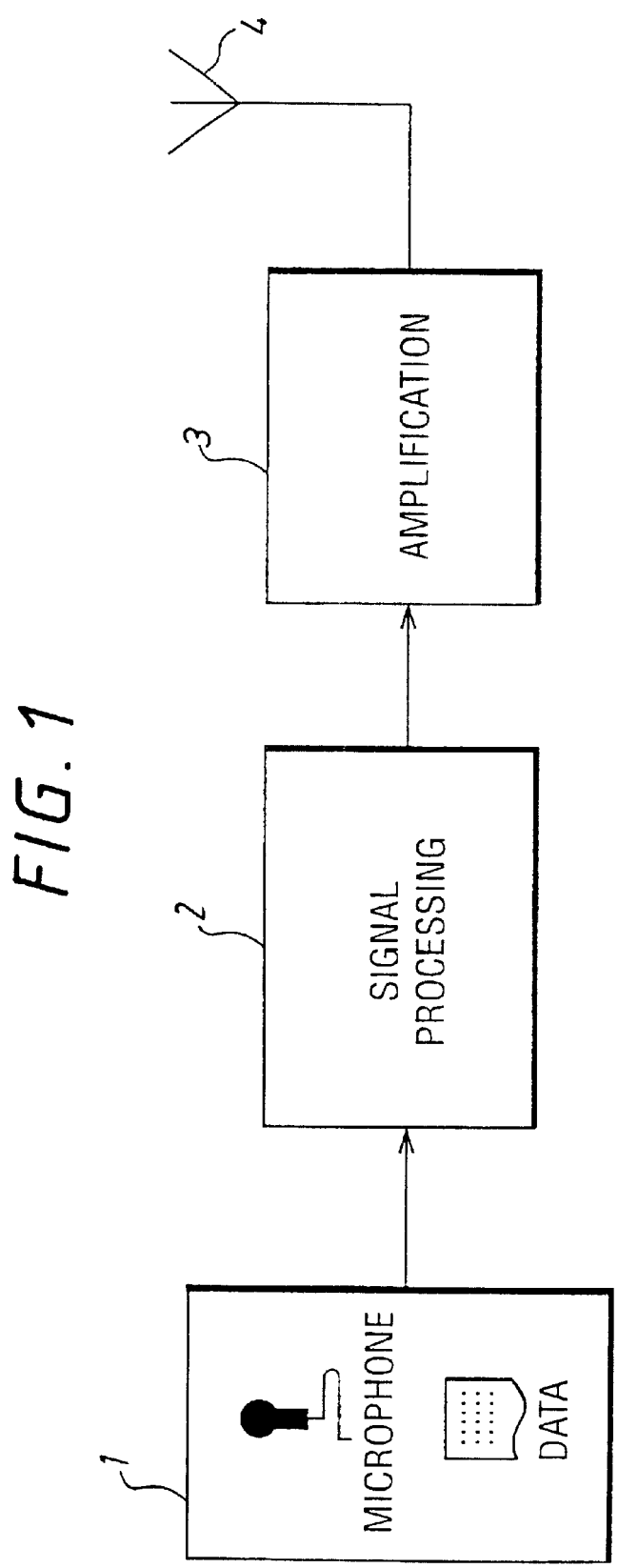
FIG. 1 is a block diagram of a conventional radio transmitter.
Figure 2:
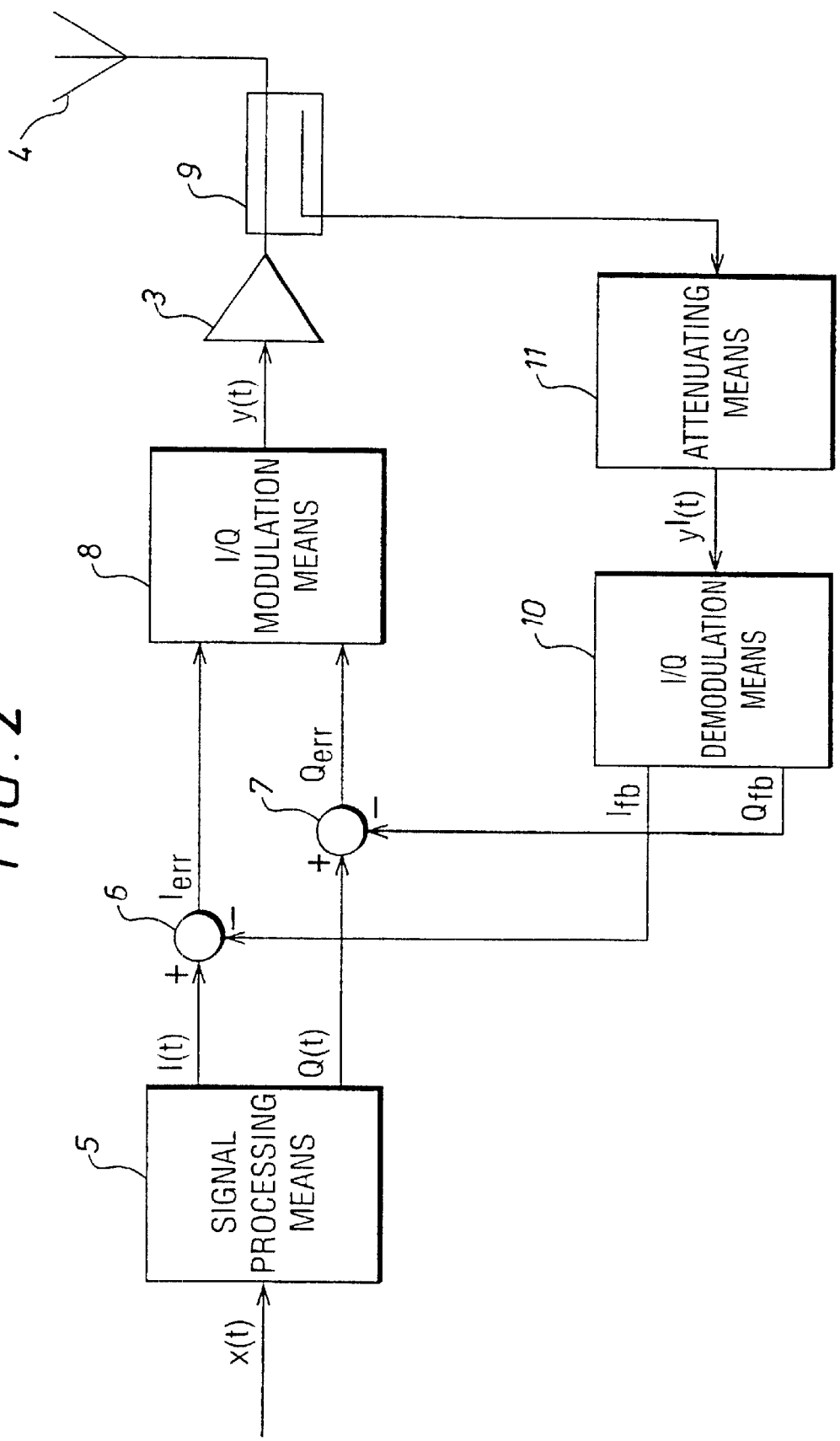
FIG. 2 is a schematic diagram of a signal processing system using conventional Cartesian feedback control.
Figure 3:
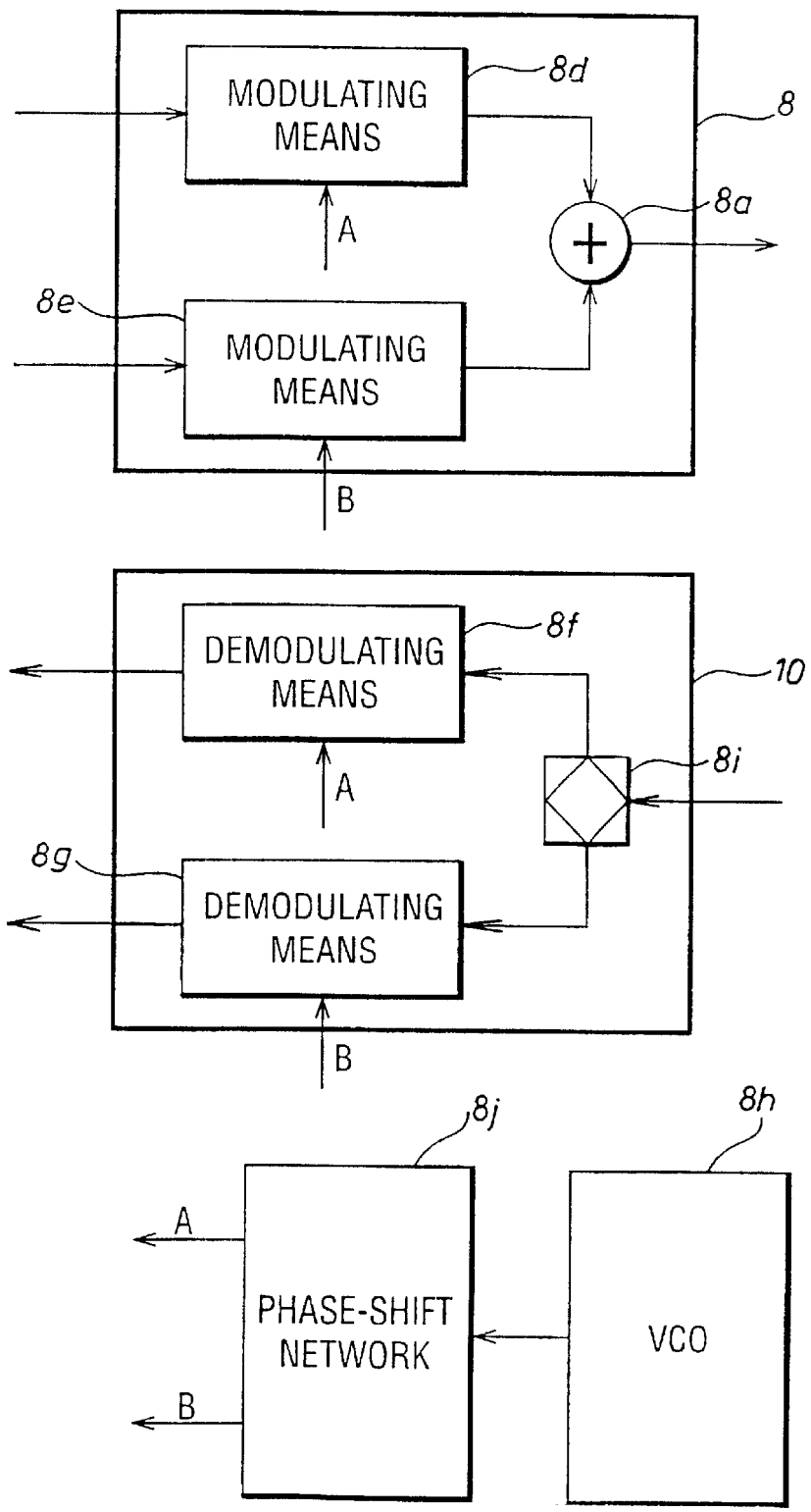
FIG. 3 is a schematic depiction of a prior art upconversion and combination means as conventionally used in Cartesian feedback control.
Figure 4:
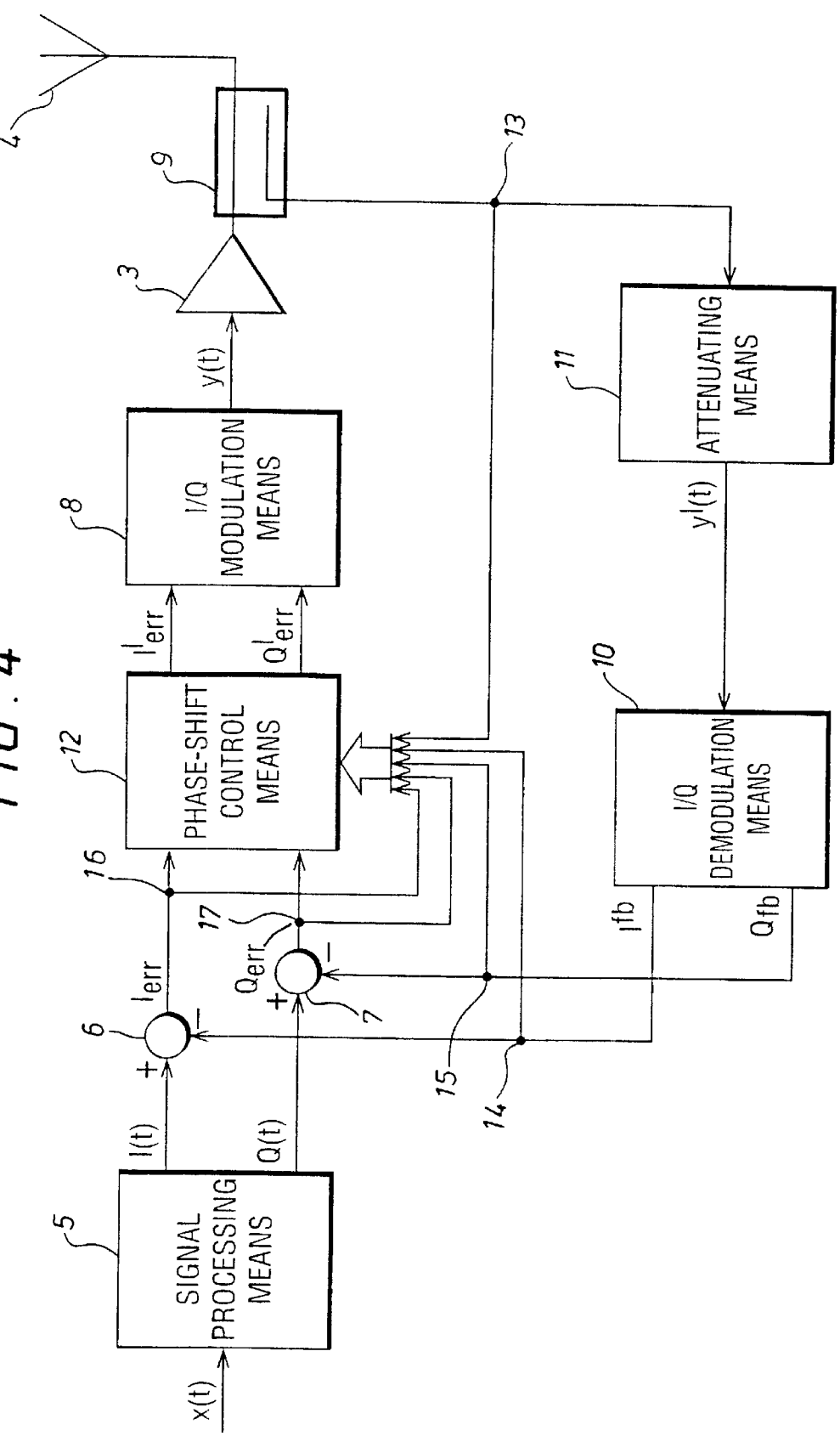
FIG. 4 is a schematic depiction of the signal processing system of this invention in use controlling a power amplifier.

Referring now to the drawings, FIG. 4 is a schematic depiction of the signal processing system of this invention in use controlling a power amplifier. In this embodiment, a signal which is to be transmitted (x(t)) is split into an in-phase and a quadrature component (I(t) and Q(t)) by a signal processor (5). In-phase and quadrature feedback components (Ifb and Qfb) are then subtracted from the input signal components to form error signals (Ierr and Qerr). This subtraction is done by comparators 6 and 7. The resultant error signals are then passed through phase-shift controller (12) to an I-Q modulator (8) which modulates and combines the in-phase and quadrature error signals (Ierr and Qerr) to form a pre-amplification output signal y(t). This preamplification output signal then passes to the power amplifier (PA) (3) and subsequently to an antenna (4) for transmission.

The amplified output signal passes through a coupler (9) from which this signal is fed back through an attenuator (11). The attenuated feedback signal (y'(t)) is split into in-phase and quadrature feedback components (Ifb and Qfb) by an I-Q demodulator (10) and these feedback components are then combined with the input signal components (I(t) and Q(t)) as described above.

The phase-shift controller (12) is digitally controlled and has monitor inputs connected to various points of the circuit. In the particular embodiment of FIG. 5, the monitor inputs are from the transmission signal at terminal 13, from the in-phase and quadrature feedback components at terminals 14 and 15 and from the in-phase and quadrature error signals at terminals 16 and 17, though additional monitor inputs could also be taken or a selection from these inputs may be sufficient in other circumstances. Thus, the phase-shift control means (12) accurately controls the phase shift of the signals based directly on the monitor inputs.

Figure 5:
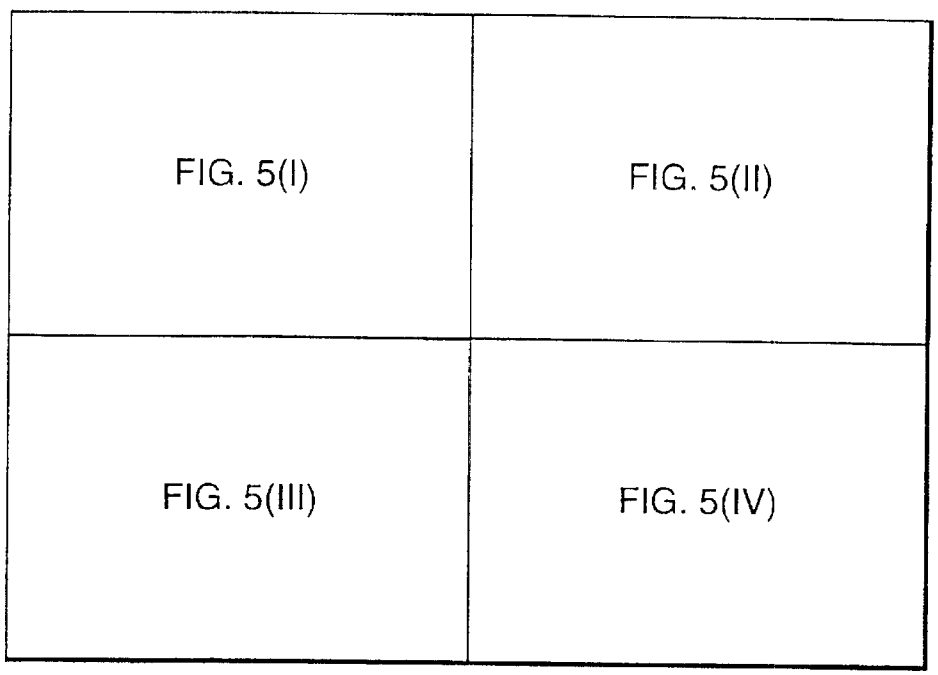

FIGS. 5(I) to 5(IV) show a particular embodiment of the invention in a radio transmitter circuit.

The present invention is embodied in the PA control module 18, which is labelled "PA Control Module". The numerals, as used in preceding paragraphs, represent the same system parts and a repeated description of these parts is omitted.

In FIG. 5(II), the frequency range $f_4$ to $f_5$ is the desired range of radio transmission frequencies which are to be produced by the transmitter.

An oscillator (19) is connected to the I-Q modulator (8) and demodulator (10) via a signal splitter (20), in order to up-convert/down-convert the incoming signals to an intermediate frequency (IF), $f_1$-intermediate between baseband and the particular desired transmission frequency. The signal in the forward path passes, via a buffer (24) to an up converter (22) which up-converts the signal to a higher, radio frequency (RF), between $f_2$ and $f_3$, which is close to the desired transmission frequency (ie. close to the desired frequency which is in the range of $f_4$ to $f_5$). This up-conversion from IF to RF is carried out using a synthesizer circuit (24) which is connected to the up converter (22) via a signal splitter (23). The synthesizer is controlled to produce a signal at the desired frequency within the wide band of frequencies between $f_2$ and $f_3$.

The outgoing signal is then passed through a pair of tunable filters (25, 26) which are separated by a buffer circuit (26). These filters are controlled by a processor (28) in order to further increase the spectral accuracy of the radio transmitter. In a similar manner to the phase control, this frequency control is based on monitored signal values from at least one predetermined point (13–17) in the signal processing system.

The output of the second tunable filter (27) is output to the downline circuit which is to be controlled, in this case a power amplifier (3).

The output of the downline circuit which is to be controlled, in this case the power amplifier (3), is sensed at a coupler (9) and is appropriately attenuated by an attenuator (11). This feedback signal is then down-converted to an intermediate frequency (IF) by a down converter (21) which is connected via a signal splitter (23) to the synthesizer module (24). This IF feedback signal is then down-converted to baseband and split into two substantially orthogonal feedback signals (Ifb, Qfb) by the I-Q demodulation means (10) which is connected to an oscillator (19) via signal splitter (20).

The two substantially orthogonal feedback signals (Ifb, Qfb) are fed back, via two buffer circuits (29, 30) to subtracters (6, 7) where they are combined with the input signal components (I(t), Q(t)) and subsequently integrated by integration circuits (31, 32) to farm the error signals (Ierr, Qerr).

In this particular embodiment, the splitting of the input signal (x(t)) into substantially orthogonal components (I(t), Q(t)) is carried out by a Digital Signal Processing (DSP) Module (5).

The input signal (x(t)) is converted into digital form by an analogue-digital converter (44), then appropriately split by a digital signal processor (39) and subsequently, the two substantially orthogonal signal components are converted back into analogue form by digital-analogue converters (42, 43).

The control loop of the second phase-shift controller (12) is closed via a multiplexer (41), and analogue-digital converter (40), a digital signal processor (39) and a slave processor (28). This same control loop is used to control the tunable filters (25, 27) at the output stage of the PA control module (18).

A final bandpass filter (53) is provided after the feedback coupler (9), for effecting elimination of unwanted transmitter harmonics.

The transmitter formatter module (54) allows the radio transmitter system to be used for sending voice data which may be input from a microphone (not shown) which would be plugged into a microphone socket (48) of the front panel (33, 55) of the radio transmitter or for sending data from other sources, ie. any sort of data, including voice data or computer data. Non-voice data or remote voice data may be input via a connector (52). Such data is then appropriately formatted by the transmitter formatter Module (54) and passed on to the transmitter DSP module (5) for splitting into substantially orthogonal signal components (I(t), Q(t)).

Various circuits (34, 35) are also provided for controlling the bias of the power amplifier (3), based on its operating temperature. A variety of monitoring, controlling and fail-safe circuits are also provided (36, 37, 38).

Figure 6:
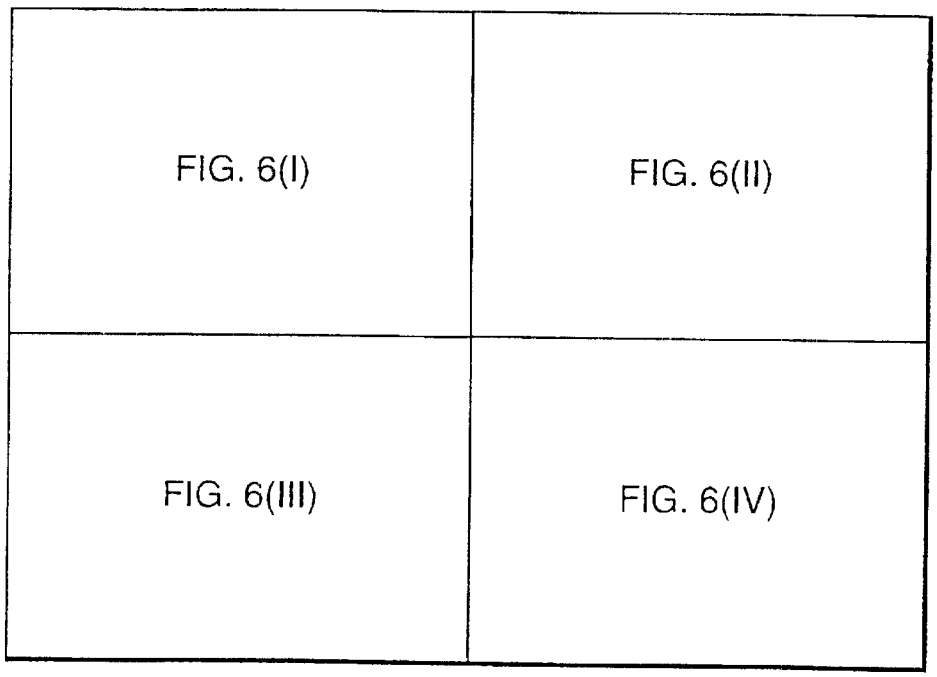
Figure 5:
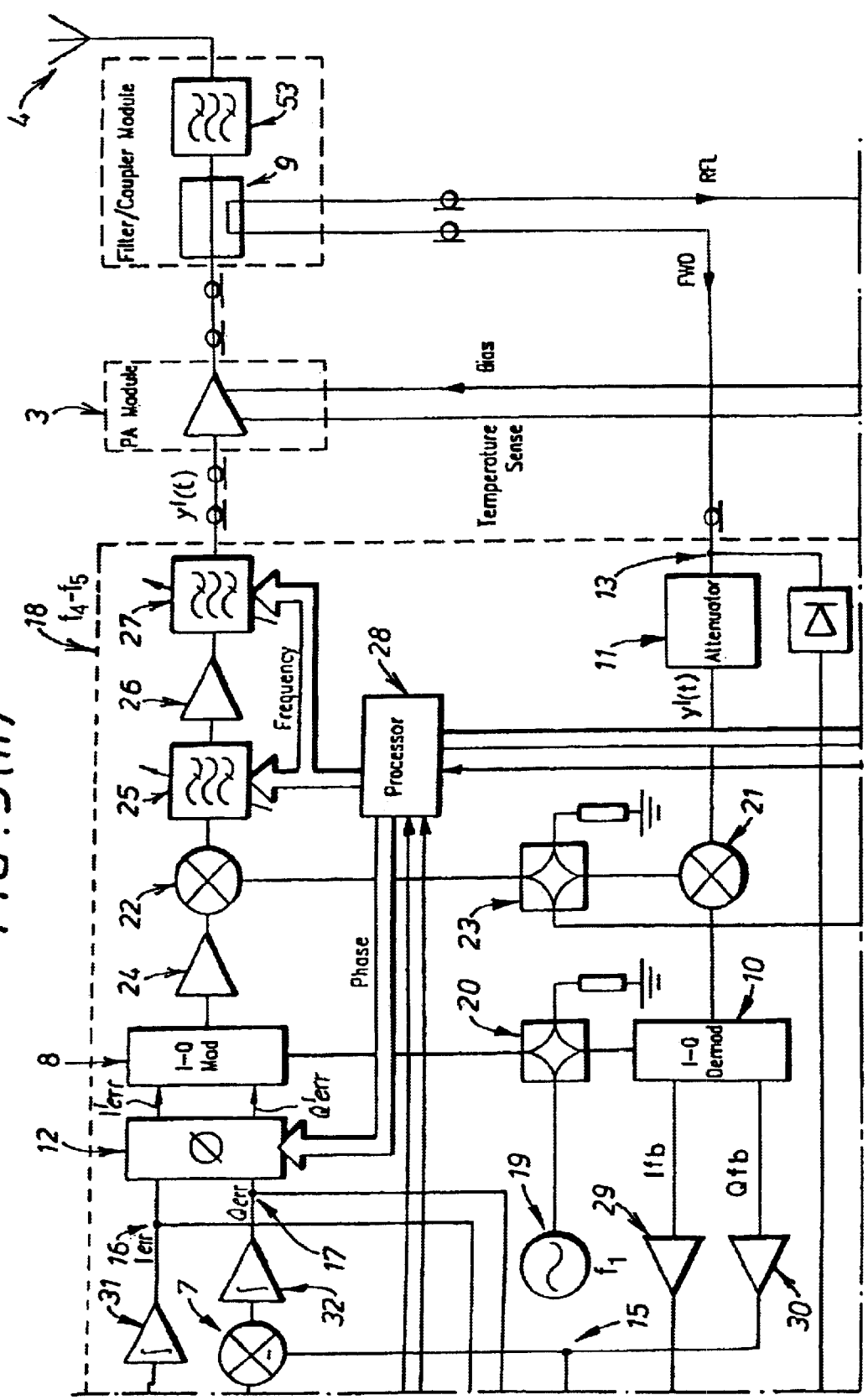
Figure 5:
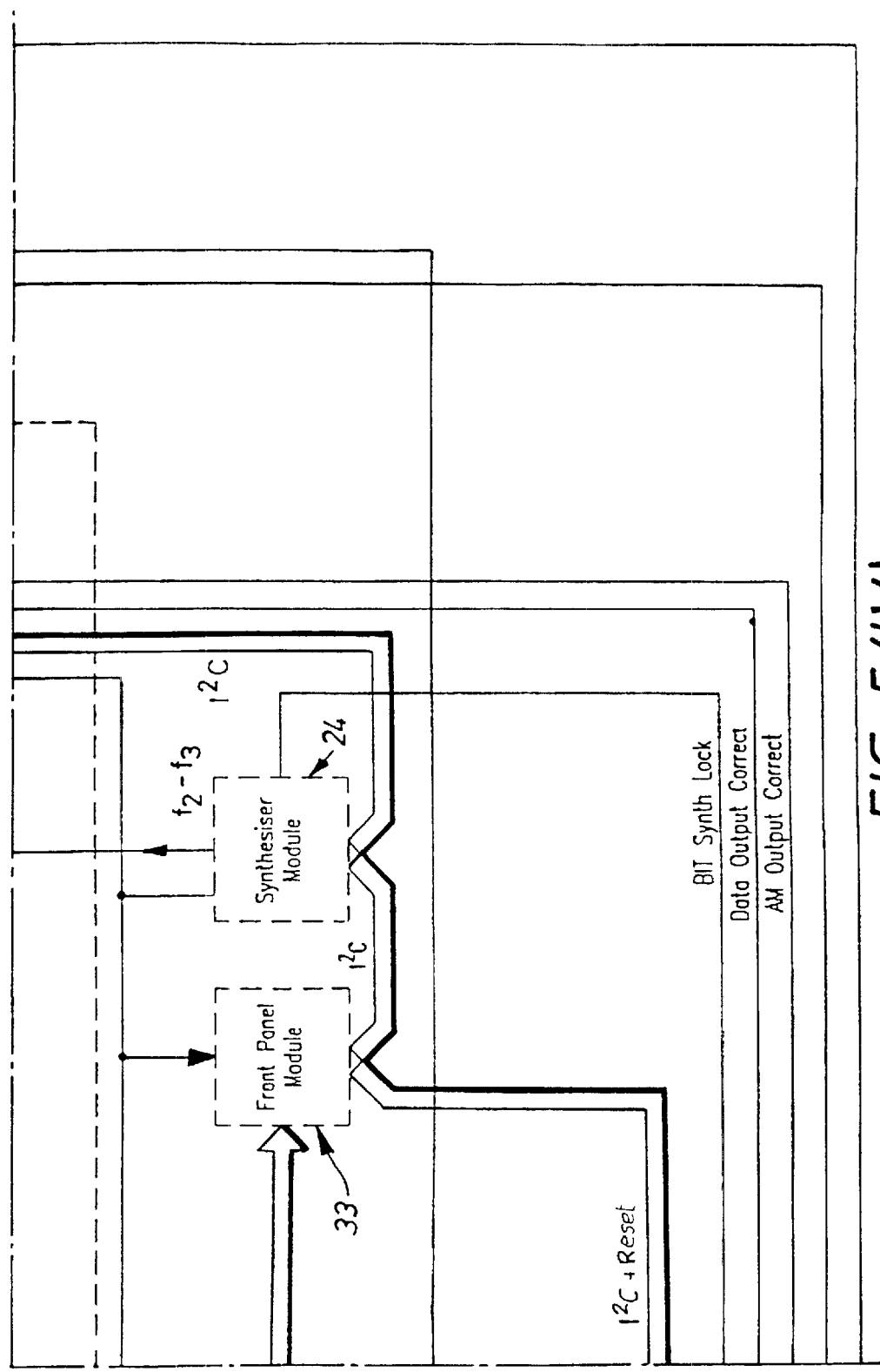
Figure 6:
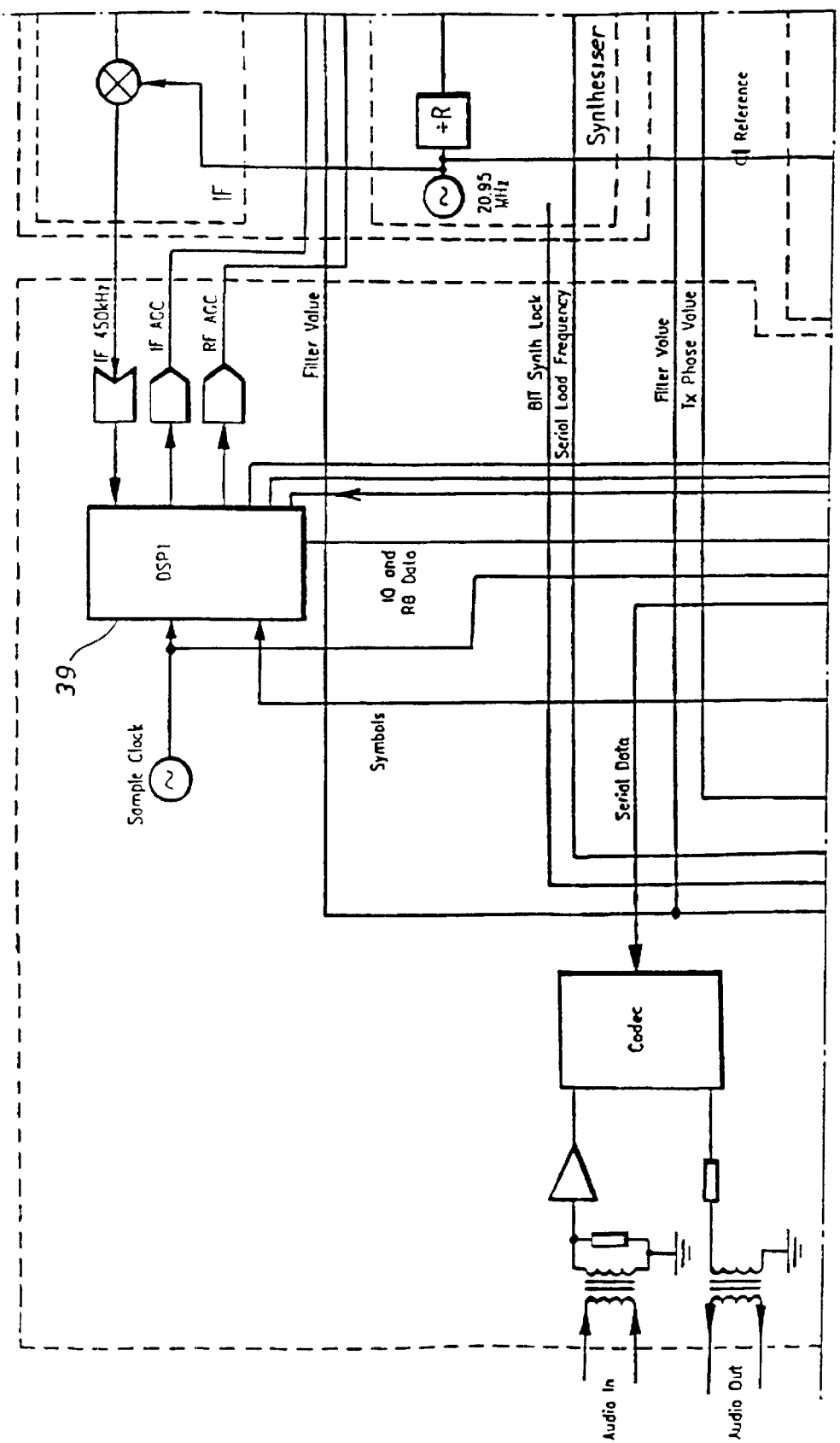
Figure 6:
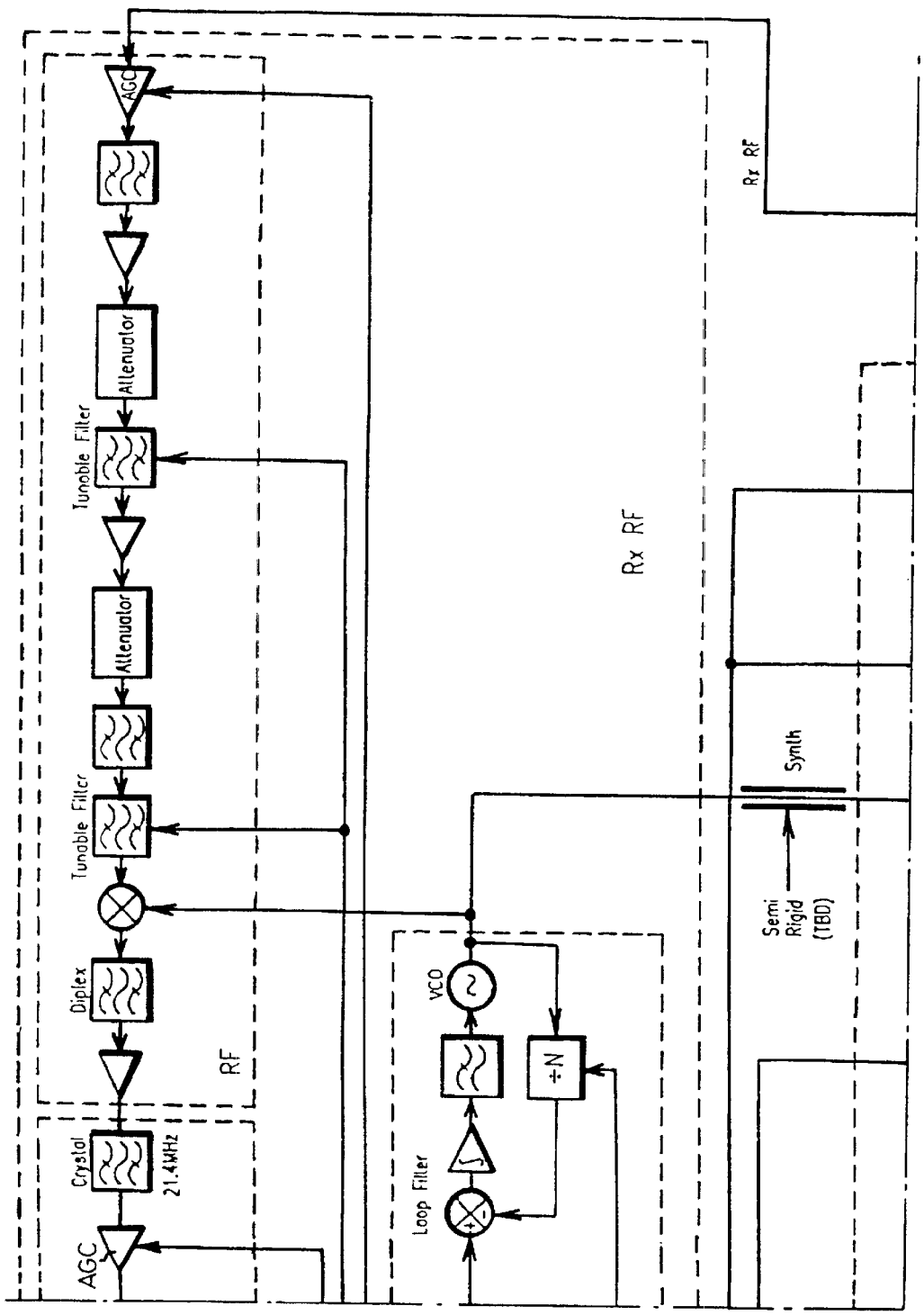
Figure 6:
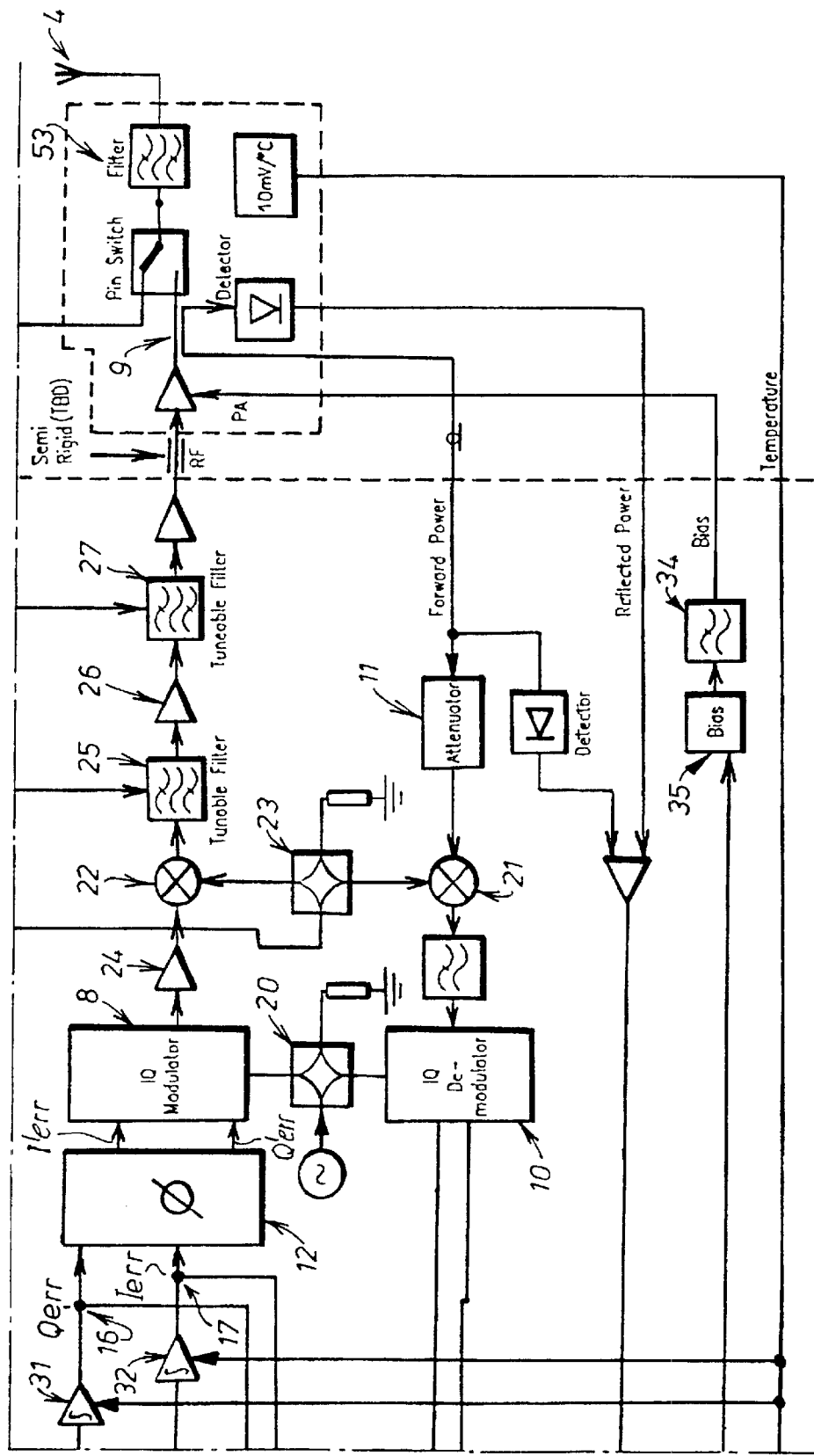

The radio transmitter circuit of FIGS. 5(I) to 5(IV) may be used with a separate receiver circuit or it may be combined with a receiver circuit in order to form a transceiver circuit such as that in FIGS. 6(I) to 6(IV).

It is to be noted, in the circuit of FIG. 6, that the circuit only uses two DSP chips (39, 55). In prior art transceiver circuits, transmission and reception have been separate activities and have thus required separate circuits. Prior art transceiver circuits required the use of one DSP chip for transmission/modulation and two DSP chips for reception /demodulation. These DSP chips are expensive. The transceiver of FIGS. 6(I) to 6(IV) uses only two chips and thus gives great advantages over prior art circuits. This is achieved through the realisation (which would not be obvious to the person skilled in the art) that the processing power of the DSP chips may be shared between transmission and reception except for in the case of "loopback mode" operation. "Loopback mode" operation is operation where the receiver side of the transceiver is used to monitor the output of the transmitter side. However, this loopback mode may be realised with a very simplified reception function, since the signal being monitored is strong, with a high signal-to-noise ratio and the direction which the signals are coming from is known.

So, in the transceiver of FIGS. 6(I) to 6(IV) part of the two DSP chips (39, 55) is configured to operate as a receiver; part of the two DSP chips (39, 55) is configured to run as a transmitter and part of the chips (39, 55) is configured to run as a very much simplified receiver'using a reduced sample rate. This innovative use of the chips allows the transceiver to be built using only two DSP chips with a corresponding cost reduction in manufacture.

Although the invention has been described in terms of a radio transmitter/transceiver embodiment, the person skilled in the art would understand that the teaching of this invention can be easily applied to a large number of applications where accurate control of an element is required. The present invention presents a method of improving Cartesian loop control systems which allows the use of a Cartesian loop in a system operating over a wide band of frequencies as a stable means to implement phase correction.

What is claimed is:

1. An apparatus for modulating a carrier signal on the basis of an input signal to generate an output signal, said apparatus comprising a control loop having a forward path and a feedback path, said forward path comprising:
    means for converting the input signal into a pair of signal components whose phases are orthogonal to each other;
    first combining means for combining each of the pair of the orthogonal signal components with a respective different one of a pair of demodulated feedback signals to generate a pair of error signals;
    modulating means for modulating a carrier wave on the basis of the pair of error signals to form a pair of modulated signals; and second combining means for combining the pair of modulated signals to form the output signal, and said feedback path comprising:

a feedback coupler for coupling a portion of the output signal into the feedback path; means for splitting the coupled signal into a pair of orthogonal feedback signals whose phases are orthogonal to each other; and demodulating means for demodulating the pair of orthogonal feedback signals to form the said pair of demodulated feedback signals, whereby said forward path further comprises a phase-shift control means operable to introduce a phase shift from 0–360° into the said pair of error signals.

2. An apparatus according to claim 1, wherein said phase-shift control means is arranged to introduce a phase-shift determined on the basis of monitored signal values from at least one predetermined point in the control loop.

3. An apparatus according to claim 1, wherein the phase-shift control means is digital.

4. An apparatus according to claim 1, wherein the phase-shift control means is digitally controlled.

5. An apparatus according claim 2, wherein the phase-shift control means is auto-calibrated.

6. An apparatus according to claim 5, wherein said apparatus further comprises means for generating an initialising sequence to generate a feedback signal, said phase-shift control means being arranged to compare the feedback signal with a predicted feedback signal to correct the phase-shift on the basis of the comparison result thereby achieving auto-calibration.

7. An apparatus according to claim 6, further comprising digital control means for controlling the phase-shift control means, wherein said digital control means is arranged to correct the phase-shift on the basis of an algorithm.

8. An apparatus according to claim 1, wherein the phase-shift control means is arranged to control the gain of the control loop and to compensate for variable gains in other components in the loop.

9. An apparatus according to claim 6, wherein said forward path further comprises an amplifier for amplifying the output signal wherein said feedback coupler is arranged to couple a portion of the amplified output signal into the feedback path.

10. An apparatus for modulating a carrier signal on the basis of an input signal to generate an output signal, said apparatus comprising a control loop having a forward path and a feedback path, said forward path comprising:

a converter operable to convert the input signal into a pair of signal components whose phases are orthogonal to each other;

first and second combiners, each of the first and second combiners operable to combine a respective one of the pair of orthogonal signal components with a respective different one of a pair of demodulated feedback signals to generate a pair of error signals;

a phase-shift controller operable to introduce a phase-shift from 0–360° into the said pair of error signals;

first and second modulators respectively operable to modulate a carrier wave on the basis of the pair of phase-shifted signals output by the phase-shift controller to form a pair of modulated signals; and a third combiner operable to combine the pair of modulated signals to form the output signal, and said feedback path comprising:

a feedback coupler for coupling a portion of the output signal into the feedback path;

a splitter operable to split the coupled signal into a pair of orthogonal feedback signals whose phases are orthogonal to each other; and a demodulator operable to demodulate the pair of orthogonal feedback signals to form the said pair of demodulated feedback signals.

11. An apparatus according to claim 10, wherein the phase-shift controller is operable to introduce a phase-shift determined on the basis of monitored signal values from at least one predetermined point in the control loop.

12. An apparatus according to claim 10, wherein the phase-shift controller is digital.

13. An apparatus according to claim 10, wherein the phase-shift controller is digitally controlled.

14. An apparatus according to claim 10, wherein the phase-shift controller is auto-calibrated.

15. An apparatus according to claim 14, wherein the apparatus further comprises a signal generator operable to generate an initializing sequence in order to generate a feedback signal, the phase-shift controller being arranged to compare the feedback signal with a predicted feedback signal to correct the phase-shift on the basis of the comparison result, thereby achieving auto-calibration.

16. An apparatus according to claim 15, further comprising a digital controller operable to control the phase-shift controller, wherein said digital controller is arranged to correct the phase-shift on the basis of an algorithm.

17. An apparatus according to claim 10, wherein the phase-shift controller is arranged to control the gain of the control loop and to compensate for variable gains in other components in the loop.

18. An apparatus according to claim 10, wherein said forward path further comprises an amplifier operable to amplify the output signal, wherein said feedback coupler is arranged to couple a portion of the amplified output signal into the feedback path.

* * * * *